(12) United States Patent
Saunders

(10) Patent No.: US 9,910,178 B2
(45) Date of Patent: Mar. 6, 2018

(54) ACCESSORY DETECTION

(71) Applicant: Cirrus Logic International Semiconductor Ltd., Edinburgh (GB)

(72) Inventor: Sunil Saunders, London (GB)

(73) Assignee: Cirrus Logic, Inc., Austin, TX (US)

( * ) Notice: Subject to any disclaimer, the term of this patent is extended or adjusted under 35 U.S.C. 154(b) by 69 days.

(21) Appl. No.: 14/963,891

(22) Filed: Dec. 9, 2015

(65) Prior Publication Data
US 2017/0153347 A1 Jun. 1, 2017

Related U.S. Application Data

(60) Provisional application No. 62/260,986, filed on Nov. 30, 2015.

(51) Int. Cl.
*G01V 3/02* (2006.01)
*G01R 27/02* (2006.01)
(Continued)

(52) U.S. Cl.
CPC ............ *G01V 3/02* (2013.01); *G01R 27/02* (2013.01); *H01R 24/58* (2013.01);
(Continued)

(58) Field of Classification Search
CPC .... G01L 1/10; G01L 1/20; G01L 1/22; G01N 17/00; G01N 27/02; G01N 27/04;
(Continued)

(56) References Cited

U.S. PATENT DOCUMENTS

2005/0201568 A1* 9/2005 Goyal ................ H04M 1/6058
381/74
2009/0180629 A1* 7/2009 Sander ................... H04M 1/05
381/58
(Continued)

OTHER PUBLICATIONS

Combined Search and Examination Report under Sections 17 and 18(3), Application No. GB1606840.5, dated Jun. 15, 2016, 6 pages.

*Primary Examiner* — Tung X Nguyen
*Assistant Examiner* — Robert P Alejnikov, Jr.
(74) *Attorney, Agent, or Firm* — Jackson Walker L.L.P.

(57) ABSTRACT

This application relates to methods and apparatus for detecting the presence of an accessory device connected to a host device via suitable connector. The apparatus includes a test signal generator and impedance measuring block. The apparatus is operable in an accessory connection discovery mode wherein the test signal generator applies a test signal to a first contact of the connector while a second contact of is connected to a reference node. The impedance measuring determines an impedance measure between said first and second contacts and the apparatus determines whether an accessory is connected based on said measure of impedance. The test signal generator may also have functionality including a microphone bias generator and the impedance measuring block may be a microphone detect block. The contact to which the test signal is applied may be varied while the remaining contact of the connector are connected to the reference node.

19 Claims, 2 Drawing Sheets

(51) Int. Cl.
*H01R 24/58* (2011.01)
*H04M 1/725* (2006.01)
*H04R 5/04* (2006.01)
*H04M 1/02* (2006.01)
*H04M 1/60* (2006.01)

(52) U.S. Cl.
CPC .......... *H04M 1/72527* (2013.01); *H04R 5/04* (2013.01); *H04M 1/0274* (2013.01); *H04M 1/6058* (2013.01); *H04R 2420/05* (2013.01)

(58) Field of Classification Search
CPC ..... G01R 27/00; H01R 24/00; G06F 11/3051; H04R 5/04; H04R 2420/05
USPC ............. 324/691; 381/58, 74, 123; 439/577; 710/15
See application file for complete search history.

(56) References Cited

U.S. PATENT DOCUMENTS

| | | | | |
|---|---|---|---|---|
| 2011/0099298 | A1* | 4/2011 | Chadbourne | G06F 11/3051 710/10 |
| 2011/0199123 | A1* | 8/2011 | Maher | H03K 5/24 327/50 |
| 2013/0320993 | A1* | 12/2013 | Mehrabi | G01R 31/04 324/508 |
| 2014/0241535 | A1 | 8/2014 | Poulsen et al. | |

\* cited by examiner

ACCESSORY DETECTION

This application relates to methods and apparatus for detection of accessory devices.

Many electronic devices are operable with accessory apparatus that may be removably connected to the electronic device for use via a suitable connector. For example many contemporary electronic devices have the facility to connect with audio accessories. Mobile telephones, tablets, laptop computers and the like are examples of electronic devices that are operable with audio accessories such as a headset, for example, that is external to and distinct from the electronic device. Headsets typically comprise mono or stereo speakers for audio playback and some headsets may also have a microphone for voice communication.

Such external accessory devices are often connected via a mating connector such as a plug and receptacle arrangement. For instance, many audio accessories have a jack plug for connection to a suitable jack socket on the host electronic device. A well-known arrangement for a jack plug and its associated socket is the 3.5 mm TRRS (Tip-Ring-Ring-Sleeve), which has four contacts for left audio, right audio, microphone, and ground.

In many devices it is desirable for the electronic device to be able to detect when an accessory is connected to the host device. Thus commonly the host device may comprise circuitry, such as a jack detect circuit, to allow the host device to determine when a suitable connector has been inserted. Various type of jack detect arrangements are known, for instance the presence of a suitable jack plug inserted fully into the socket may operate a mechanical switch to complete or disconnect a circuit coupled to a jack detect signal line. Monitoring the jack detect signal line, e.g. by comparison with a known threshold voltage, gives an indication of whether a jack plug is inserted or not. In other arrangements the jack plug itself may form part of a jack detect circuit when inserted.

The present disclosure describes methods and apparatus for detecting the presence of a connected accessory device that may be used in addition to or instead of a conventional dedicated jack detect circuit.

Thus according to an embodiments there is provided an apparatus for detecting the presence of an accessory connected to a connector of a host device, the apparatus comprising:
 a test signal generator; and
 an impedance measuring block;
 the apparatus being operable in an accessory connection discovery mode in which:
  the test signal generator is configured to apply a test signal to a first contact of said connector whilst a second contact of said connector is connected to a reference node;
  the impedance measuring block is configured to determine a measure of an impedance between said first and second contacts;
  wherein the apparatus determines whether an accessory is connected based on said measure of impedance.

The apparatus is configured to apply a test stimulus to a first contact of the connector whilst at least a second contact is connected to a reference node, for example ground, so as to allow determination of a measure of impedance between the first and second contacts. As will be described in more detail later if no accessory is present the relevant contacts will generally be open circuit and thus a high impedance measure will be determined. However if an accessory is connected there may be a conductive path via a load that presents a lower impedance and thus the measure of impedance determined may be used to detect the presence of an accessory.

In some embodiments the host device may be used with a range of different accessories which may include different types of accessory and applying a test signal, i.e. a stimulus, to a given contact of the accessory via the first contact of the connector of the host device may not produce a detectable change in impedance. In some embodiments during the accessory connection discovery mode the test signal generator may be configured to periodically apply a test signal to the second contact of said connector whilst the first contact of said connector is connected to the reference node and the impedance measuring block may be configured to determine a measure of an impedance between said second and first contacts and determine whether an accessory is connected based on said measure of impedance, i.e. the measure of impedance for the second contact. Varying the contact to which the stimulus is applied increases the reliability of detection. In some embodiments the stimulus may be sequentially applied to any of the contacts of the connector that may function as a reference, e.g. ground contact for at least some accessories, as will be described in more detail below.

The apparatus may be configured such that, when the test signal is being applied to one of the first or second contacts, at least a third contact of the connector is connected to the reference node. In other words whilst the test signal is applied to one contact of the connector, e.g. the first contact, a plurality of the other contacts are connected to the reference node, e.g. ground. In some embodiments all other contacts of the connector, i.e. all contacts other than that to which the test signal is applied, are connected to the reference node. Connecting a plurality of contacts of the connector to the reference node can aid reliability of detection as will be described in more detail below.

The test signal may be any electrical signal that may be used for determining the measure of impedance. In some embodiments the test signal may comprise an applied bias and the test signal generator may comprise a bias generator. However in some embodiments the test signal may be a varying AC signal.

The bias generator may be a microphone bias generator operable, in use, with an accessory having a microphone connected to said connector to provide a bias for operating said microphone.

The impedance measuring block may comprise a microphone detection block configured to, in use, in the event that an accessory connected to said connector is detected, to determine whether either of the first or second contacts of said connector is connected to a microphone of the accessory. However in other embodiments other impedance measuring blocks may be used.

The connector may be a jack socket. The connector may be a tip-first ring-second ring-sleeve (TRRS) socket.

The first contact may be one of the sleeve contact and the second ring contact and said second contact is the other of the sleeve contact and the second ring contact.

The test signal generator may be configured to apply the test signal to the first contact periodically.

The apparatus may determine whether an accessory is connected by comparing said measure of impedance with known value of impedance. The known value of impedance may be a predetermined threshold value.

The known value of impedance may instead be based on one or more preceding measurements. In some embodiments the known value of impedance comprises the previously acquired measure of impedance.

The apparatus may further comprise a controller for controlling switching of one or more switches to vary the socket contacts connected to the test signal generator, the impedance measuring block and the reference node. At least one of the switches may be a switch of the host device which does not form part of an integrated circuit with the test signal generator and impedance measuring block. At least one of the switches may be a switch of the host device which does form part of an integrated circuit with the test signal generator and impedance measuring block.

The apparatus may be configured, in the event that a variation from a known value of impedance is detected, to generate an alert.

The apparatus may further comprise a jack detect block coupled to a jack detect contact of the socket.

The apparatus may comprise an integrated circuit. The apparatus may comprise a codec.

Aspects also relate to an electronic device having an apparatus as claimed in any preceding claim and a connector for connecting to an accessory.

In a further aspect there is provided an audio circuit comprising:
 a microphone bias generator configured to, in use, generate a bias for operating a microphone of an accessory connected to a connector of a host device;
 a microphone detect block configured to, in use, detect whether an accessory connected to said connector of a host device has a microphone connected to either first or second contacts of said connector;
 wherein the circuit is operable in an accessory connection discovery mode in which:
 the microphone bias generator is configured to apply a bias to the first contact of said connector whilst the second contact of said connector is connected to a ground node;
 the microphone detect block is configured to determine a measure of an impedance of a signal path connected to said first contact and determine whether an accessory is connected based on said measure of impedance.

In a further aspect there is provided a jack socket with tip, first ring, second ring and sleeve contacts;
 a test signal generator;
 an impedance measuring block;
 a ground node,
 a switch arrangement operable in:
 a first configuration to connect both the test signal generator and impedance measuring block to the sleeve contact and to connect the ground node to the second ring contact; and
 a second configuration to connect both the test signal generator and impedance measuring detect block to the second ring contact and to connect the ground node to the sleeve contact;
 wherein the device is operable in an accessory connection discovery mode in which the switch arrangement is configured to alternate between the first and second configurations and in each configuration the test signal generator is generate a test signal and the impedance measuring block is configured to determine a measure of an impedance in said configuration and detect a variation from a known value of impedance for said configuration.

In a further aspect there is provided an electronic device comprising:
 a jack socket with tip, first ring, second ring and sleeve contacts;
 a microphone bias generator;
 a microphone detect block;
 a ground node,
 a switch arrangement operable in:
 a first configuration to connect both the microphone bias generator and microphone detect block to the sleeve contact and to connect the ground node to the second ring contact; and
 a second configuration to connect both the microphone bias generator and microphone detect block to the second ring contact and to connect the ground node to the sleeve contact;
 wherein the device is operable in an accessory connection discovery mode in which the switch arrangement is configured to alternate between the first and second configurations and in each configuration the microphone bias generator is generate a bias and the microphone detect block is configured to determine a measure of an impedance in said configuration and detect a variation from a known value of impedance for said configuration.

In a further aspect there is provided an apparatus for detecting the presence of an accessory connected to a connector of a host device, the apparatus comprising: an impedance measuring block;
 the apparatus being operable in an accessory connection discovery mode in which:
 the impedance measuring block is configured to apply a test signal to a first contact of said connector whilst a second contact of said connector is connected to a reference node;
 the impedance measuring block is configured to determine a measure of an impedance between said first and second contacts;
 wherein the apparatus determines whether an accessory is connected based on said measure of impedance.

Aspects also relate to a method of detecting the presence of an accessory connected to a connector of a host device, the connector having a plurality of contacts, the method comprising:
 varying between a plurality of test configurations, wherein in each test configuration a test signal is applied to a different one of the contacts of the connector that may be used as a ground contact for an accessory whilst a plurality of the other contacts are connected to a reference node;
 in each test configuration determining a measure of impedance between the contact to which the test stimulus is applied and at least one of the contacts connected to the reference node; and
 determining whether an accessory is present based on the measure of impedance.

The invention will now be described by way of example only with respect to the accompanying drawings, of which:

Figure 1:
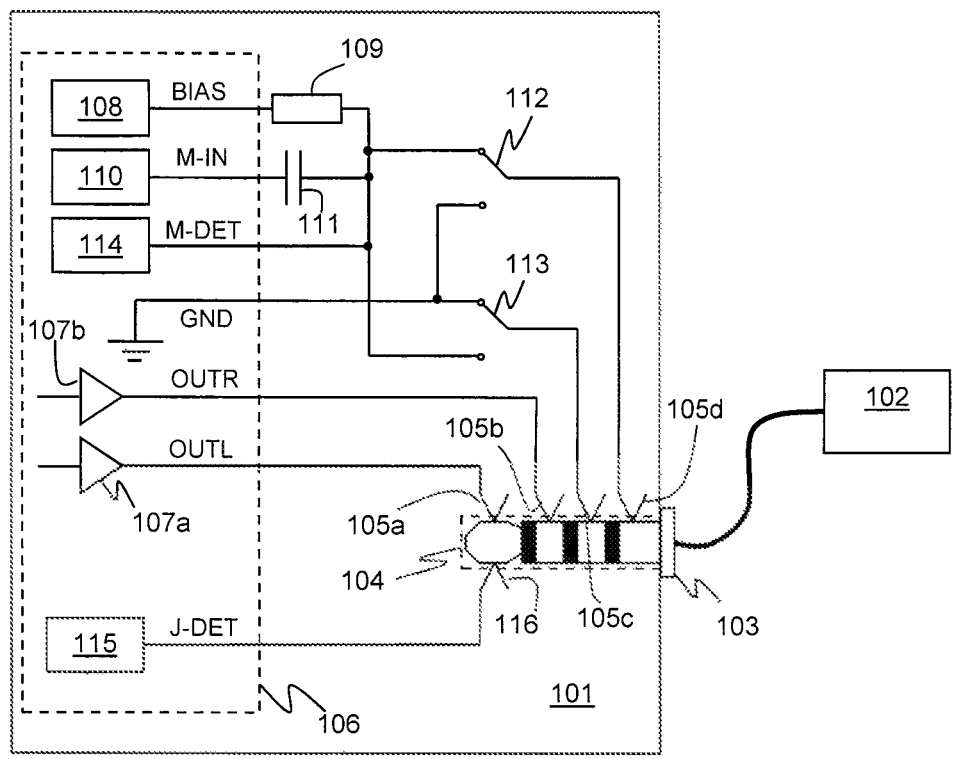
FIG. 1 illustrates an electronic device connected to an accessory.

As described above many electronic devices are configured so as to be connected to accessory devices via a suitable connector. FIG. 1 illustrates an electronic device 101, which will be referred to herein as a host device, which may be connected to an accessory device 102 via a jack plug 103 of the accessory device and a socket 104 of the host device.

The socket 104 is configured so as to be able to receive a suitable jack plug, for example a 3.5 mm jack plug. The socket has four contacts 105a-d configured so as to be operable with a 4-pole TRRS (Tip-Ring-Ring-Sleeve) jack plug. Conventionally for audio accessories the tip (T) and first ring (R1) are used for left and right audio respectively with the second ring (R2) and sleeve (S) used for the microphone and ground (G). The appropriate contacts 105a-d of the socket 104 may therefore be connected in use to appropriate signals paths within the host device 101 and may for example be connected to audio circuitry such as an audio codec 106.

FIG. 1 thus illustrates that output drivers 107a and 107b may be connected in use to provide left and right audio signals to contacts 105a and 105b respectively.

For operation of the microphone, a bias generator 108 may generate a suitable bias voltage to be applied to a microphone contact of the socket, typically via at least one resistor 109 which may form part of a filter. Input circuitry 110 for receiving the microphone signal is connected to the same contact in use, typically via at least one DC blocking capacitor 111.

However some audio accessories use the second ring R2 of the jack plug for receiving the microphone and the sleeve S for a ground path whereas other audio accessories use the second ring R2 for ground and the sleeve S for the microphone. To allow use with either type of accessory device the electronic device typically comprises switch arrangements 112 and 113 for allowing either of the signal paths connected to the second ring R2 and sleeve S to be used for ground and the other for the microphone. It will be clear to one skilled in the art that the switch arrangements 112 and 113 may comprise a plurality of different switching elements and elements of the switching arrangements may be implemented at different parts of the host device, i.e. some switches elements could be at the socket and/or some switch elements may be part of the codec 106. It will be understood that the arrangement illustrated in FIG. 1 is by way of example only and various different switch arrangements for providing alternative signal paths between the sleeve socket contact 105d say and the bias generator 108 or ground node GND may be implemented.

In use, on first connection of an accessory, a microphone detect block 114 of the host device may determine whether a microphone is present in the accessory and, if so, which configuration to use. The microphone detect block typically operates by effectively making an impedance measurement for the relevant contact when a bias is supplied from the bias generator 108.

To detect whether or not an accessory is connected a jack detect block 115 is typically provided, the jack detect block being connected to a jack detect contact 116 of the socket 104 which is operated by insertion and removal of the plug 103 into the socket 104.

It has been appreciated that in some instances the jack detect arrangement may fail to operate correctly. In use dirt, fluff or other foreign material may enter the jack socket and become lodged therein and may result in blocking of correct operation of the jack detect contact 116. For instance a mechanical switch may become blocked and/or an electrical contact of the jack detect circuitry may be blocked. Removing such material from the jack socket is not easy due to the nature of the socket.

It has therefore been appreciated that it may be advantageous to be able to detect connection of an accessory device that does not rely solely on such a jack detect circuit. Such means of detecting connection of an accessory device may provide a secondary means of detecting connection of an accessory device in addition to a dedicated jack detect circuit. This can provide redundancy or back-up detection of connection of an accessory device in the event that functioning of the dedicated jack defect circuitry fails to operate correctly. Alternatively such jack detection may, in some embodiments, avoid the need for dedicated jack detect circuitry, i.e. jack detect block 115 and jack detect contact 116.

It has also been appreciated that there are a range of different accessory devices which may, in use, be connected to a host device at different times via the same connector. For instance there are a range of different types of audio accessories which may be connected to a host device via the 3.5 mm jack socket described above. Additionally there are a range of other, non-audio accessories that may be connected to a host device, e.g. via the 3.5 mm jack socket.

In embodiments of the present invention the presence of a connected accessory may be determined by periodically determining a measure of impedance between contacts of the connector of the host device. The measure of impedance may be determined by applying a test signal, e.g. a bias voltage, to a first contact of a connector of a host device, whilst a second contact of the connector of the host device is connected to a reference node, e.g. a ground node. A measure of impedance is then determined between the first and second contacts. This provides an indication of the impedance of any signal path connected to the first contact. In some embodiments the relevant connector of the host device is a socket capable of operating with a TRRS jack plug. In such embodiments the test signal, e.g. bias, may be applied to either a second ring or sleeve contact of the socket with an impedance measuring block connected to that contact of the socket and the other of the second ring or sleeve contact of the socket connected to the reference, e.g. ground, node. In other words the first contact may be either the second ring or sleeve contact of the socket and the second contact may be the other of the second ring or sleeve contacts.

The test signal is applied to allow the determination of impedance effectively between the first and second contacts, i.e. of a signal path within the accessory. The test signal may be any suitable test signal suitable for determining impedance. In some embodiments the test signal may be a bias applied to the contact.

The source of bias may be a bias generator which is also present for providing a bias in use when an appropriate accessory is connected. For instance the bias generator may be configured to provide a bias suitable for biasing a microphone of an accessory if an accessory having a microphone is connected. Applying a bias may be useful for biasing any active circuitry of the accessory. However other forms of test signal and/or test signal generator may be used.

The impedance measuring block may be an impedance measuring block that is also present for determining an impedance associated with a contact of the connector once presence of an accessory has been detected, for instance in order to correctly configure the host device and/or derive suitable settings for the particular accessory that is connected. For example the impedance measuring block may comprise a microphone detect block which is also configured to, once it is detected that an accessory is connected, determine whether a microphone of the accessory device is connected to the second ring socket contact or the sleeve socket contact.

It should be appreciated that although described as separate elements in some functions the test signal generator may form part of, or be located with, the impedance measuring block. In some embodiments however the test signal generator may, as described above, provide a different function in use with an accessory connected.

Thus embodiments of the present invention may make use of a microphone bias generator and microphone detect circuitry which may typically be present in a host device in any case. It will be appreciated however that other impedance measuring functionality may be provided in a host device, for instance in some devices an headphone impedance measuring block may be operable with an output driver to determine an impedance of a connected headphone for instance by monitoring the response to a varying current signal. In some embodiments therefore the impedance measuring block may additionally or alternatively comprise a headphone impedance measuring block.

Embodiments can therefore provide a means of providing an accessory connection detection function that does not require significant additional circuitry.

Referring back to FIG. 1, the host device 101 may be operable in an accessory connection discovery mode to discover connection of an accessory device. During the accessory connection discovery mode the jack detect block will monitor the signal from the jack detect contact 116 of the socket to detect when a jack plug is inserted into the plug. However as the jack detect function may not be operating correctly the host device also applies a secondary accessory detection.

Thus during the accessory connection discovery mode the test signal generator, which in this example is bias generator 108, may be configured to periodically generate a bias voltage to be supplied to one of the contacts 105c or 105d of the socket, for example sleeve contact 105d as illustrated, whilst the other of socket contacts 105c or 105d is connected to ground, i.e. the reference node. During such an accessory connection discovery mode of operation the impedance measuring block, which is this example is the microphone detect block 114, is also connected to determine a measure of impedance of the signal path including the contact to which the bias is applied, i.e. the impedance between the relevant contacts. If an accessory is connected then the resultant impedance measured will depend on the impedance presented at the relevant plug contact by the accessory device. The measure of impedance determined may therefore be compared with a known value of impedance.

If no accessory is connected then the impedance at the relevant contact would expected to be high, as the signal path will effectively be open circuit apart from any leakage currents/paths. With an accessory connected providing a signal path the impedance will typically be much lower. The impedance measuring block may therefore effectively be configured to detect an occurrence of a lower impedance.

In some embodiments therefore the known value may be a predetermined threshold value. If the measured impedance is below the threshold value this may be taken as being an indication that an accessory is connected. The relevant threshold value may be programmable and/or may be determined by analysis or some initial calibration. Thus if the microphone detect block indicates that the measure of impedance is lower than some predetermined value then an alert that an accessory device is connected may be generated, for instance by generating an interrupt for an applications processor of the host device.

In some embodiments however the measure of impedance may be determined periodically and each time compared to a known value of impedance based on one or more preceding measurement. Any significant variation in impedance between the most recently acquired measurement and the historic measurements may be indicative that the impedance has changed significantly due to connection of an accessory device. The known value could be the previous measure or some value derived from one or more previous measurements, for instance the average of a certain number of previous measurements. Conveniently however as the accessory connection discovery mode may operate continuously when an accessory is not connected, and may in some embodiments operate even during a host device sleep mode, the amount of processing applied is limited so as to limit power consumption. Comparing the most recently measurement with a previous measurement is a simple process that can be readily performed by the codec itself.

In the event that a significant change in impedance is detected this could then be used to generate the suitable alert, e.g. an interrupt.

In some embodiments during accessory connection discovery mode the first socket contact to which the bias is applied and the second socket contact connected to the ground node may be the same each time. Thus for example the bias may be applied each time to sleeve contact 105 whilst the second ring contact 105c is connected to the ground node. For audio accessories with an ECM type microphone such an arrangement should provide a detectable change in impedance on connection of an accessory device irrespective of whether the ground and microphone connections are correct for that accessory or not.

Figures 2A, 2B:
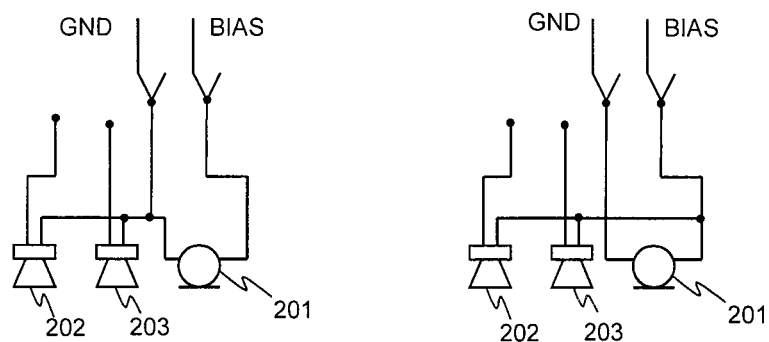
FIGS. 2a and 2b illustrate two configurations in which audio accessory devices may be connected.

For example consider that the bias is supplied to the sleeve contact 105d of the socket and the second ring contact of the socket is connected to ground, i.e. the host device is configured in a LRGM configuration, i.e. with TRRS contacts being configured for left audio, right audio, ground and microphone respectively. If a connected accessory does indeed have a LRGM configuration then the microphone of the accessory will be connected between the bias node and the ground node and impedance determined for the sleeve contact 105d will include the microphone impedance. This is illustrated in FIG. 2a which illustrates the bias being applied to the bias node of the accessory and the ground contact of the socket being connected to the common ground of the accessory. In this case the impedance measured will be the impedance of accessory microphone 201.

Were the accessory to have a LRMG configuration then, as illustrated in FIG. 2b, the bias would be applied to a common path in the accessory device. In effect the microphone 201 is connected in parallel with the left and right loudspeakers 202 and 203 of the accessory device. In which case a detectable change in impedance should still result.

Thus for detecting connection of an audio accessory such as described a significant change in impedance should be detected with the bias being supplied to the socket sleeve contact 105d and the socket second ring contact 105c connected to ground, i.e. with the host device in LRGM configuration, whether the accessory is a LRGM accessory or a LRMG accessory.

As mentioned above however it has been appreciated that there are a range of different accessory devices that may be used with some host electronic devices and which may be connected to the host device with the same plug and socket that may be used for audio, i.e. the 3.5 mm TRRS socket of the host device. For instance there are a variety of accessories designed to be connected to a smart phone or tablet computers via the 3.5 mm TRRS socket so as to provide additional functionality. Such accessories include for example additional sensors such a thermometers or infrared sensor, magnetic card readers, fm transmitters etc.

In some accessories it may be the case that a TRRS jack plug connector is used with one of the second ring or sleeve contacts being used as a ground, say the second ring contact, but the arrangement of the accessory may be such that no impedance is present between the other of these contacts, e.g. the sleeve contact, and ground. If the bias voltage were thus supplied to the sleeve contact of the jack plug it may be that no significant change in impedance may be detected. However if the bias were supplied to the second ring socket contact, and thus to the common ground of the accessory, it is likely that the impedance of components of the accessory connected to the tip and first ring contacts of the jack plug would be detectable—in a similar fashion as discussed above with regard to loudspeakers 202 and 203 of FIG. 2b.

For instance consider that the accessory connected comprises an active circuit between the sleeve (S) and second ring (R2) contact that only presents a load when biased in a particular polarity, and has open-circuits on the first ring (R1) contact and tip (T) contact. Some accessories that use the socket simply to provide power may have such a configuration. In such a case if the bias were applied to the second ring (R2) contact and the sleeve (S) contact were connected to ground the detected impedance may remain high as the active circuit may be biased in the opposite polarity and the tip (T) and first ring (R1) contacts are open circuit. However if the bias is supplied to the sleeve (S) contact with the second ring (R2) contact grounded then the load would be detected by a reduced impedance measurement.

Likewise consider that there is an active circuit between the sleeve (S) and second ring (R2) contacts that presents a load only when biased in a particular polarity and with a high enough voltage, but includes low impedance loads on the first ring (R1) and Tip (T) contacts, as may be the case with some headsets. This may not be detected by applying a relatively low voltage (e.g. 1.8V) bias on the Sleeve (S) contact and grounding the second ring contact (R2), even if in the correct polarity, but would be detected using the opposite configuration. When the second ring (R2) contact is used for bias and measurement, it is the first ring (R1) load and Tip (T) load that are actually measured.

Thus it has been appreciated that supplying the bias to the ground contact of the accessory can actually improve the likelihood of detection of connection of an accessory, especially using relatively low voltages. However as the configuration of the accessory is unknown it is useful to vary the socket contacts to which the bias is applied.

Conveniently at least some, and possibly all of the other contacts are grounded (e.g. connected to the reference node) when the test signal, e.g. bias is supplied. It is common for many devices that the outputs for the left and right audio pull automatically to ground when no accessory device is detected as being connected and thus in a typical device the socket contacts for the tip and first ring contact will be grounded when doing an accessory detect.

This gives the best chance of detection regardless of the accessory since it causes each of the loads to act in parallel (each load of the accessory will be connected to the accessory ground contact) and at least one of the loads is likely to be passive and have measurable impedance even with relatively low bias voltage.

The test signal, e.g. bias, may thus be applied to any of the contacts of the connector that may correspond to the ground contact of the accessory device.

In some embodiments therefore during the accessory connection discovery mode the configuration of the connections to the contacts of the connector, e.g. socket, may be swapped periodically so as to alter the contacts which are connected to the reference node and to which the test signal is applied. In other words at a first time a bias voltage may be applied to the first socket contact with the second socket contact connected to ground and the impedance at the first contact determined. At a second time the bias may instead be supplied to the second socket contact with the first socket contact being connected to ground and the impedance at the second contact determined. In each case the impedance determined for the signal path including the relevant first or second socket contact to which the bias was applied may be compared to a stored value for that contact, e.g. the previous measurement taken in that configuration.

This should allow detection of connection of an accessory in at least one of the configurations. Changing the configuration in this way can also reduce the bias voltage required for successful detection of connection of some types of accessory such as some types of active headset as described above.

The host device may be configured to alternate the application of the test signal, e.g. bias, to the first and second sockets contacts in any desired sequence. For instance a certain number of measurements of impedance based on a first configuration (e.g. bias to the first socket contact and ground to the second socket contact) may be taken before swapping to the reverse configuration and taking a certain number of measurements of impedance. Conveniently however so as to avoid any delay between connection of an accessory and it being detected the configuration may be changed after each measurement.

Thus, when in operating in accessory connection discovery mode the host device may alternate between the configurations, e.g. between setting up the socket as a LRGM configuration and a LRMG configuration and then may apply a pulse of microphone bias in each configuration. The microphone detection block may determine an impedance value and compare it to the previously measured value to detect any significant change.

In one embodiment during the accessory connection discovery mode some control procedure may be used to synchronously start a timer and also start the microphone detection block in continuous polling mode, for example by initiating a write sequence of commands. During the period that the timer is running, a pulse of microphone bias is applied and the microphone detection block takes an impedance measurement. After the timer reaches its maximum value another write sequence may be triggered, e.g. by an event-logger or some other control module. This write sequence changes the socket contact configuration (e.g. from LRMG to LRGM or vice versa) and starts a second timer. During the period that the second timer is running, another pulse of microphone bias is applied and the microphone detection block takes an impedance measurement, albeit on the other socket contact to the previous measurement. After the second timer reaches its maximum value the respective event-logger triggers a third write sequence. This write sequence changes the socket contact configuration back and restarts the first timer.

The whole flow may loop continuously. At any time that the microphone detection block measures an impedance sufficiently different from the previous measurement, an interrupt will be raised and the flow can be stopped by disabling the event-loggers.

Note that all blocks may be clocked by the same relatively slow clock signal and are started synchronously by the initial write sequence. This ensures that impedance measurement never coincides with reconfiguration.

As mentioned the clock speed may be relatively low, i.e. the period between successive impedance measurements may be relatively long. For example a clock speed of the order of 32 kHz or so may be used but any suitable low system clock may be used. The frequency at which the impedance measurements are determined may be chosen based on any suitable interval between measurements, which may for instance be of the order of 100 ms or so. The interval may be configurable and in some instances may vary based on a usage profile for a user.

The bias voltage supplied may be of the order of 1.8V in some embodiments although the bias used may depend on the device. The pulse of bias voltage need only be applied for a short time, say of the order of 150 μs or so although other periods may be used and this period may be configurable. This means that the operation of the microphone bias and microphone detect block for detecting accessory connection may be low power. Further the accessory detection may be performed by the codec itself, as would be the case with a conventional jack detect circuit, and thus monitoring for connection of an accessory may be performed by the codec 106. Thus an applications processor of the host device may be able to enter a sleep mode whilst the host device still performs monitoring for connection of an accessory device via the codec, as is the case for a conventional jack detect.

In the event that connection of an accessory is detected, whether by the jack detect block 115 (if present) or through detecting a significant change in measured impedance, then the codec may leave the accessory connection discovery mode and attempt to discover the type of accessory connected and configuration thereof as is conventional.

In use with an accessory connected the impedance measuring block may continue to monitor in use the impedance of the contact to which it is connected. For instance in many audio accessories a button press of the accessory varies the impedance of the signal path and thus detecting a change in impedance is used to signal a button press. Disconnection of an accessory could thus be detected as the relevant signal path would go high impedance.

In embodiments where there is no jack detect block the detection of a significant change in impedance may thus be a primary indication of connection of an accessory. in embodiments where there is also a jack detect block the detection of a significant change in impedance may be a secondary detection. In the event that a jack detect block is present and has not signalled that an accessory has been connected whilst a significant change in impedance is detected the codec and/or host device may be configured to react in various ways. For instance the fact that a significant change in impedance is detected but the jack detect has not signalled to indicate connection of a jack plug may be signalled to an application processor for the host device. In some embodiments the applications processor may be configured to ask a user to confirm whether or not an accessory is connected. If the user confirms that an accessory has been connected the host device may be configured to ignore the jack detect block unless and until a positive jack detection is subsequently made. In any case if the detection of a significant change in impedance is used as an indication of a connected accessory or it is confirmed that an accessory is connected, the signal from the jack detect block which would typically signal subsequent disconnection of the accessory may be ignored.

Figure 3:
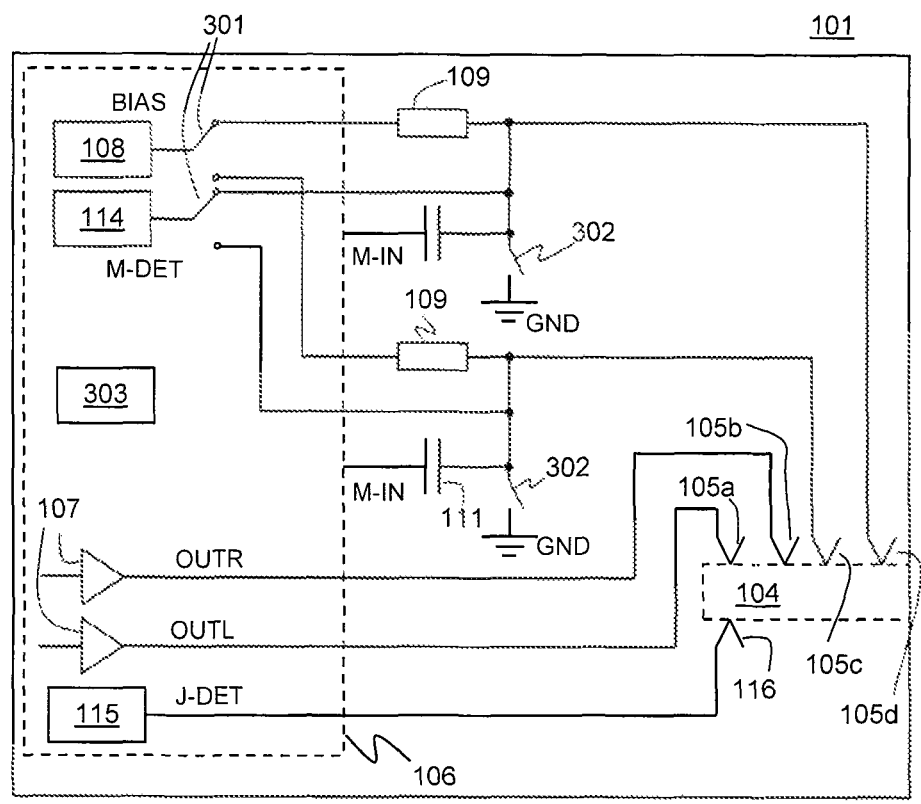
FIG. 3 illustrates an electronic device according to an embodiment.

FIG. 3 illustrates an alternative embodiment, where similar items to those discussed above with reference to FIG. 1 are identified by similar reference numerals. In the embodiment illustrated in FIG. 3 the codec 106 directly controls switches 301 to connect the bias generator 108 and microphone detect block 114 to the socket contacts 105c and 105d as required, but external switches 302 are controlled, e.g. via general purpose input/output pins on the codec (not shown) to control at least part of the connection of the signals paths of the socket contacts. The codec 106 and external switches may be configured by a controller 303 which may also run the timers/event-loggers etc.

Note that as used herein the term 'block' is used to refer to a functional unit or module which may be implemented at least partly by dedicated hardware components such as custom defined circuitry and/or at least partly be implemented by one or more software processors or appropriate code running on a suitable general purpose processor or the like. A block may itself comprise other blocks or functional units.

It will of course be appreciated that various embodiments discussed above or various blocks or parts thereof, such as the impedance measuring block(s), may be co-integrated with other blocks or parts thereof or with other functions of a host device on an integrated circuit such as a Smart Codec.

The term node may be taken to mean any point along an electrical path and does not necessarily imply a terminal, connection point or contact of a connector (although clearly a terminal, connection point or contact may be a node).

A circuit according to an embodiment of the present invention may be implemented as an integrated circuit and may be implemented in a host device. The term host device is used in this specification to refer to any electronic or electrical device which is removably connectable to an external accessory apparatus. The host device may especially be a portable and/or battery powered host device such as a mobile telephone, an audio player, a video player, a PDA, a mobile computing platform such as a laptop computer or tablet and/or a games device for example. A removable accessory apparatus is any apparatus which may be connected to and used with a host device. The peripheral apparatus may for instance be a headset, e.g. a set of headphones, earbuds or the like, possibly including a microphone.

It will be appreciated that a jack plug and jack socket is just one example of a connector for a removable accessory device. The same issue could apply to any mating connector, e.g. plug-and-receptacle, where there is a plug detect arrangement that could be blocked in use.

The skilled person will thus recognise that some aspects of the above-described apparatus and methods, may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An apparatus for detecting the presence of an accessory connected to a connector of a host device, the connector being a tip-first ring-second ring-sleeve (TRRS) jack socket, the apparatus comprising: a test signal generator; and an impedance measuring block;
   the apparatus being operable in an accessory connection discovery mode in which:
   the test signal generator is configured to apply a test signal to a first contact of said connector whilst a second contact of said connector is connected to a reference node;
   the impedance measuring block is configured to determine a measure of an impedance between said first and second contacts; wherein the apparatus determines whether an accessory is connected based on said measure of impedance; and
   wherein, during the accessory connection discovery mode: the test signal generator is configured to periodically apply a test signal to the second contact of said connector whilst the first contact of said connector is connected to the reference node; and the impedance measuring block is configured to determine a measure of an impedance between said second and first contacts and determine whether an accessory is connected based on said measure of impedance.

2. An apparatus as claimed in claim 1 wherein the apparatus is configured such that, when the test signal is being applied to one of the first or second contacts, at least a third contact of the connector is connected to the reference node.

3. An apparatus as claimed in claim 2 wherein the apparatus is configured such that, when the test signal is being applied to one of the first or second contacts, all other contacts of the connector are connected to the reference node.

4. An apparatus as claimed in claim 1 wherein the test signal generator comprises a bias generator.

5. An apparatus as claimed in claim 4 wherein the bias generator is a microphone bias generator operable, in use, with an accessory having a microphone connected to said connector to provide a bias for operating said microphone.

6. An apparatus as claimed in claim 1 wherein the impedance measuring block comprises a microphone detection block configured to, in use, in the event that an accessory connected to said connector is detected, to determine whether either of the first or second contacts of said connector is connected to a microphone of the accessory.

7. An apparatus as claimed in claim 1 wherein said first contact is one of the sleeve contact and the second ring contact and said second contact is the other of the sleeve contact and the second ring contact.

8. An apparatus as claimed in claim 1 wherein the test signal generator is configured to apply said test signal to the first contact periodically.

9. An apparatus as claimed in claim 1 wherein the apparatus determines whether an accessory is connected by comparing said measure of impedance with known value of impedance.

10. An apparatus as claimed in claim 9 wherein said known value of impedance is a predetermined threshold value.

11. An apparatus as claimed in claim 9 wherein the known value of impedance is based on one or more preceding measurements.

12. An apparatus as claimed in claim 11 wherein the known value of impedance comprises the previously acquired measure of impedance.

13. An apparatus as claimed in claim 1 comprising a controller for controlling switching of one or more switches to vary the socket contacts connected to the test signal generator, the impedance measuring block and a ground node.

14. An apparatus as claimed in claim 13 wherein at least one said switches is a switch of the host device which does form part of an integrated circuit with the test signal generator and impedance measuring block.

15. An apparatus as claimed in claim 1 further comprising a jack detect block coupled to a jack detect contact of the socket.

16. An apparatus as claimed in claim 1 wherein the apparatus comprises an integrated circuit.

17. An apparatus as claimed in claim 1 wherein the apparatus comprises a codec.

18. An electronic device having an apparatus as claimed in claim 1 and a connector for connecting to an accessory.

19. An electronic device comprising:
   a jack socket with tip, first ring, second ring and sleeve contacts;
   a test signal generator;
   an impedance measuring block;
   a ground node,
   a switch arrangement operable in:
      a first configuration to connect both the test signal generator and impedance measuring block to the sleeve contact and to connect the ground node to the second ring contact; and
      a second configuration to connect both the test signal generator and impedance measuring detect block to the second ring contact and to connect the ground node to the sleeve contact;
   wherein the device is operable in an accessory connection discovery mode in which the switch arrangement is configured to alternate between the first and second configurations and in each configuration the test signal generator is generate a test signal and the impedance measuring block is configured to determine a measure of an impedance in said configuration and detect a variation from a known value of impedance for said configuration.

* * * * *